(12) United States Patent
Kim (10) Patent No.: US 10,699,758 B2
(45) Date of Patent: Jun. 30, 2020

(54) DELAY CIRCUIT AND SEMICONDUCTOR SYSTEM USING THE DELAY CIRCUIT

(71) Applicant: SK hynix Inc., Icheon-si Gyeonggi-do (KR)

(72) Inventor: Kwan Dong Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/200,304

(22) Filed: Nov. 26, 2018

(65) Prior Publication Data
US 2020/0013440 A1 Jan. 9, 2020

(30) Foreign Application Priority Data
Jul. 3, 2018 (KR) .................. 10-2018-0077230

(51) Int. Cl.
*G11C 7/00* (2006.01)
*G11C 7/10* (2006.01)
*G11C 7/22* (2006.01)
*H03K 5/14* (2014.01)
*H03K 5/00* (2006.01)

(52) U.S. Cl.
CPC ............ *G11C 7/1066* (2013.01); *G11C 7/222* (2013.01); *H03K 5/14* (2013.01); *H03K 2005/00078* (2013.01)

(58) Field of Classification Search
CPC .......... G11C 7/1066; G11C 7/22; H03K 5/14; H03K 2005/00078
USPC ................................................. 365/193, 194
See application file for complete search history.

(56) References Cited

U.S. PATENT DOCUMENTS

| | | | | |
|---|---|---|---|---|
| 5,144,525 A | * | 9/1992 | Saxe | ............ G11C 27/024 365/194 |
| 6,097,231 A | | 8/2000 | Moscaluk | |
| 6,160,434 A | * | 12/2000 | Yoshimura | ............ H03K 5/133 327/238 |
| 6,426,661 B1 | * | 7/2002 | Curran | ............ G06F 1/10 327/262 |
| 6,552,587 B2 | * | 4/2003 | Kim | ............ G11C 7/1051 327/158 |
| 6,574,153 B2 | * | 6/2003 | Ware | ............ G11C 7/1039 365/189.05 |
| 6,720,807 B1 | * | 4/2004 | Kubo | ............ G06F 1/10 327/141 |

(Continued)

FOREIGN PATENT DOCUMENTS

JP 07058591 A * 3/1995

*Primary Examiner* — Viet Q Nguyen
(74) *Attorney, Agent, or Firm* — William Park & Associates Ltd.

(57) ABSTRACT

A semiconductor system includes a second semiconductor device. The second semiconductor device configured to receive an external clock, first and second code signals, and input and output data. The second semiconductor device configured to adjust a delay amount depending on a combination of the first and second code signals, generate an internal clock by delaying the external clock according to the adjusted delay amount, and input and output data in synchronization with the internal clock. The second semiconductor device is adjusted in a driving force for driving the internal clock, depending on a voltage level of a node included in a path through which the internal clock is delayed.

22 Claims, 7 Drawing Sheets

(56) References Cited

U.S. PATENT DOCUMENTS

| | | | | |
|---|---|---|---|---|
| 7,019,573 B2* | 3/2006 | Matsuno | ............... | H03L 7/0812 |
| | | | | 327/158 |
| 7,068,090 B2* | 6/2006 | Hirabayashi | ............ | H03F 1/301 |
| | | | | 327/307 |
| 7,230,467 B1* | 6/2007 | Gan | ....................... | H03H 11/26 |
| | | | | 327/261 |
| 7,288,978 B2* | 10/2007 | Suzuki | ................. | H03K 3/0315 |
| | | | | 327/261 |
| 7,368,953 B2* | 5/2008 | Chu | ....................... | G11C 7/222 |
| | | | | 326/93 |
| 7,535,272 B1* | 5/2009 | Kwong | .................... | H03L 7/081 |
| | | | | 327/156 |
| 7,571,406 B2* | 8/2009 | Johnston | ............... | G06F 17/505 |
| | | | | 327/158 |
| 8,223,239 B2* | 7/2012 | Senda | .................. | H04N 5/3765 |
| | | | | 348/312 |
| 8,400,196 B2* | 3/2013 | Kim | ....................... | G11C 7/222 |
| | | | | 327/156 |
| 9,190,125 B2* | 11/2015 | Kim | ....................... | G11C 7/222 |
| 9,270,261 B2* | 2/2016 | Jiang | ....................... | H03K 5/14 |
| 9,312,837 B2* | 4/2016 | Bhatia | ...................... | H03K 5/13 |
| 10,387,606 B2* | 8/2019 | Feng | .................... | G06F 17/5081 |
| 10,469,091 B2* | 11/2019 | Roham | ................. | H03L 7/0805 |
| 2004/0131128 A1* | 7/2004 | Roy | .................. | H04L 25/03885 |
| | | | | 375/295 |
| 2006/0214688 A1* | 9/2006 | Pan | ..................... | H03K 17/145 |
| | | | | 326/83 |
| 2009/0096906 A1* | 4/2009 | Senda | ................... | H03L 7/0812 |
| | | | | 348/312 |

* cited by examiner

| Delay amount | CODE<1> | CODE<2> |
|---|---|---|
| First delay amount | H | L |
| Second delay amount | L | H |
| Third delay amount | H | H |

DELAY CIRCUIT AND SEMICONDUCTOR SYSTEM USING THE DELAY CIRCUIT

CROSS-REFERENCE TO RELATED APPLICATION

The present application claims priority under 35 U.S.C. § 119(a) to Korean Patent Application No. 10-2018-0077230 filed on Jul. 3, 2018 in the Korean Intellectual Property Office, which is incorporated herein by reference in its entirety.

BACKGROUND

1. Technical Field

Embodiments of the present disclosure generally relate to a delay circuit relating to delaying an input signal to generate an output signal, and a semiconductor system using the delay circuit.

2. Related Art

In general, semiconductor devices are packaged with other semiconductor devices to be released as a single product. Most of these semiconductor devices input and output various signals by a receiving circuit for receiving various signals transmitted from an outside, through input pads, and an output circuit for outputting internal signals through output pads.

The delay amounts of transfer paths through which such various signals are inputted and outputted are set to be different from one another, due to differences in their characteristics. Also, while synchronous semiconductor devices such as an SDRAM input and output various signals in synchronization with a clock, delay amounts when inputting and outputting signals may be variously induced depending on changes in PVT (process, voltage and temperature) characteristics. Therefore, there is demanded a technology for adjusting the delay time of a signal to be inputted and outputted, in conformity with changes in PVT characteristics.

SUMMARY

In an embodiment, a delay circuit may include: a first buffer configured to generate a first delayed signal by buffering an input signal; a voltage adjustment circuit configured to generate a second delayed signal by delaying the first delayed signal, and configured to adjust a voltage level of the second delayed signal by adjusting a voltage of a first node, included in a path through which the input signal is delayed, in response to the second delayed signal; and a second buffer configured to generate an output signal by buffering the second delayed signal.

In an embodiment, a delay circuit may include: a first buffer configured to generate a first delayed signal by buffering an input signal; a delay amount adjustment circuit configured to adjust a capacitance value of a first node, included in a path through which the input signal is delayed, in response to first and second codes, and configured to generate a second delayed signal by delaying the first delayed signal according to the adjusted capacitance value; a voltage adjustment circuit configured to generate a third delayed signal by delaying the second delayed signal, and configured to adjust a voltage level of the third delayed signal by adjusting a voltage of a second node, included in the path through which the input signal is delayed, in response to the third delayed signal; and a second buffer configured to generate an output signal by buffering the third delayed signal.

In an embodiment, a semiconductor system may include a first semiconductor device configured to receive an external clock, first and second code signals, and input and output data, adjust a delay amount depending on a combination of the first and second code signals, generate an internal clock by delaying the external clock according to the adjusted delay amount, and input and output data in synchronization with the internal clock, the first semiconductor device being adjusted in a driving force for driving the internal clock, depending on a voltage level of a node included in a path through which the internal clock is delayed.

DETAILED DESCRIPTION

Hereinafter, a delay circuit and a semiconductor system using the same will be described below with reference to the accompanying drawings through various examples of embodiments.

Various embodiments may be directed to a delay circuit and a semiconductor system using the same, capable of reducing a current consumption amount by decreasing a period in which an output signal is driven to the level of an external voltage, through being fed back with the voltage level of a node included in the delay circuit for delaying an input signal and thereby lowering or raising the voltage level of a node.

According to the embodiments, it may be possible to reduce a current consumption amount by decreasing a period in which an output signal is driven to the level of an external voltage, through being fed back with the voltage level of a node included in a delay circuit for delaying an input signal and thereby lowering or raising the voltage level of a node.

Also, according to the embodiments, it may be possible to provide a delay circuit and a semiconductor system using the same, in which a delay amount is adjusted by adjusting the capacitance value of a node included in a delay circuit for delaying an input signal.

Figure 1:
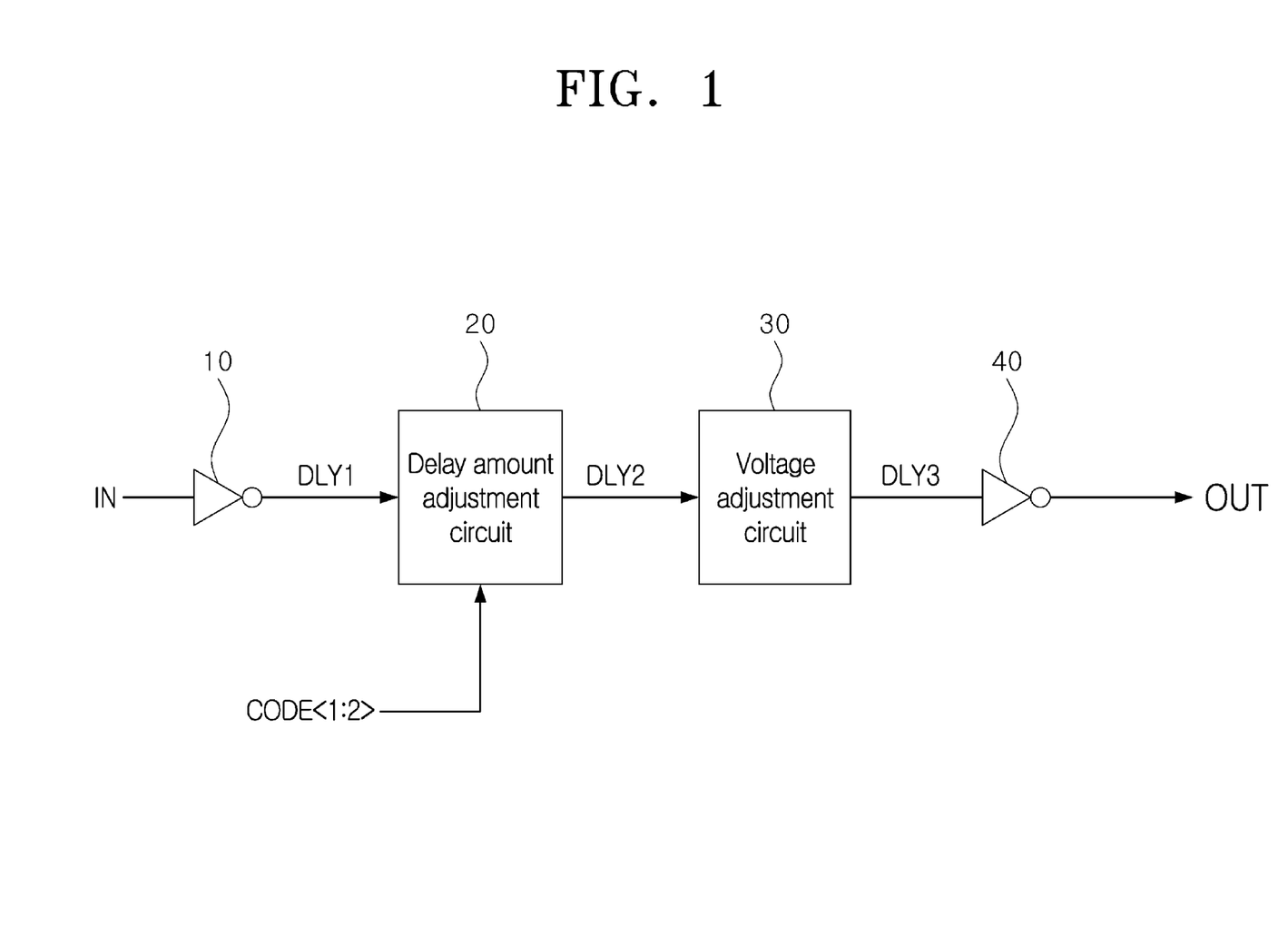
FIG. 1 is a block diagram illustrating a representation of an example of the configuration of a delay circuit in accordance with an embodiment.

As illustrated in FIG. 1, a delay circuit in accordance with an embodiment may include a first buffer 10, a delay amount adjustment circuit 20, a voltage adjustment circuit 30 and a second buffer 40.

The first buffer 10 may generate a first delayed signal DLY1 by delaying an input signal IN. The first buffer 10 may generate the first delayed signal DLY1 by inverting and buffering the input signal IN. The first buffer 10 may generate the first delayed signal DLY1 which is driven to a logic high level, in the case where the input signal IN is a logic low level. The first buffer 10 may generate the first delayed signal DLY1 which is driven to a logic low level, in the case where the input signal IN is a logic high level. According to an embodiment, the first buffer 10 may be implemented as a buffer circuit such as an inverter or a driver. According to an embodiment, the input signal IN may be set as a signal which includes at least one pulse generated for a predetermined period. According to an embodiment, the input signal IN may be set as a signal which cyclically toggles. The input signal IN may be set as a clock which is inputted from an outside.

The delay amount adjustment circuit 20 may be adjusted in its delay amount in response to a first code signal CODE<1> and a second code signal CODE<2>. The delay amount adjustment circuit 20 may generate a second delayed signal DLY2 by delaying the first delayed signal DLY1 with the delay amount adjusted in response to the first code signal CODE<1> and the second code signal CODE<2>. The delay amount of the delay amount adjustment circuit 20 may be set to a first delay amount in the case where the first code signal CODE<1> is enabled and the second code signal CODE<2> is disabled. The delay amount of the delay amount adjustment circuit 20 may be set to a second delay amount in the case where the first code signal CODE<1> is disabled and the second code signal CODE<2> is enabled. The delay amount of the delay amount adjustment circuit 20 may be set to a third delay amount in the case where the first code signal CODE<1> is enabled and the second code signal CODE<2> is enabled. The third delay amount may be set to a delay amount larger than the second delay amount. The second delay amount may be set to a delay amount larger than the first delay amount. The first code signal CODE<1> and the second code signal CODE<2> may be set as signals which are inputted from an outside to adjust the delay amount of the delay circuit. The first code signal CODE<1> and the second code signal CODE<2> may be set as signals which are inputted from a circuit such as a mode register set (MRS) to adjust the delay amount of the delay circuit.

The voltage adjustment circuit 30 may generate a third delayed signal DLY3 by delaying the second delayed signal DLY2. The voltage adjustment circuit 30 may adjust the voltage level of the third delayed signal DLY3 by adjusting the voltage level of a node (nd31 of FIG. 4) in response to the second delayed signal DLY2. The voltage adjustment circuit 30 may adjust a driving force for driving the third delayed signal DLY3 to a power supply voltage VDD or a ground voltage VSS, by adjusting the voltage level of the node (nd31 of FIG. 4) depending on the voltage level of the second delayed signal DLY2.

The second buffer 40 may generate an output signal OUT by delaying the third delayed signal DLY3. The second buffer 40 may generate the output signal OUT by inverting and buffering the third delayed signal DLY3. The second buffer 40 may generate the output signal OUT which is driven to a logic high level, in the case where the third delayed signal DLY3 is a logic low level. The second buffer 40 may generate the output signal OUT which is driven to a logic low level, in the case where the third delayed signal DLY3 is a logic high level. According to an embodiment, the second buffer 40 may be implemented as a buffer circuit such as an inverter or a driver.

Figure 2:
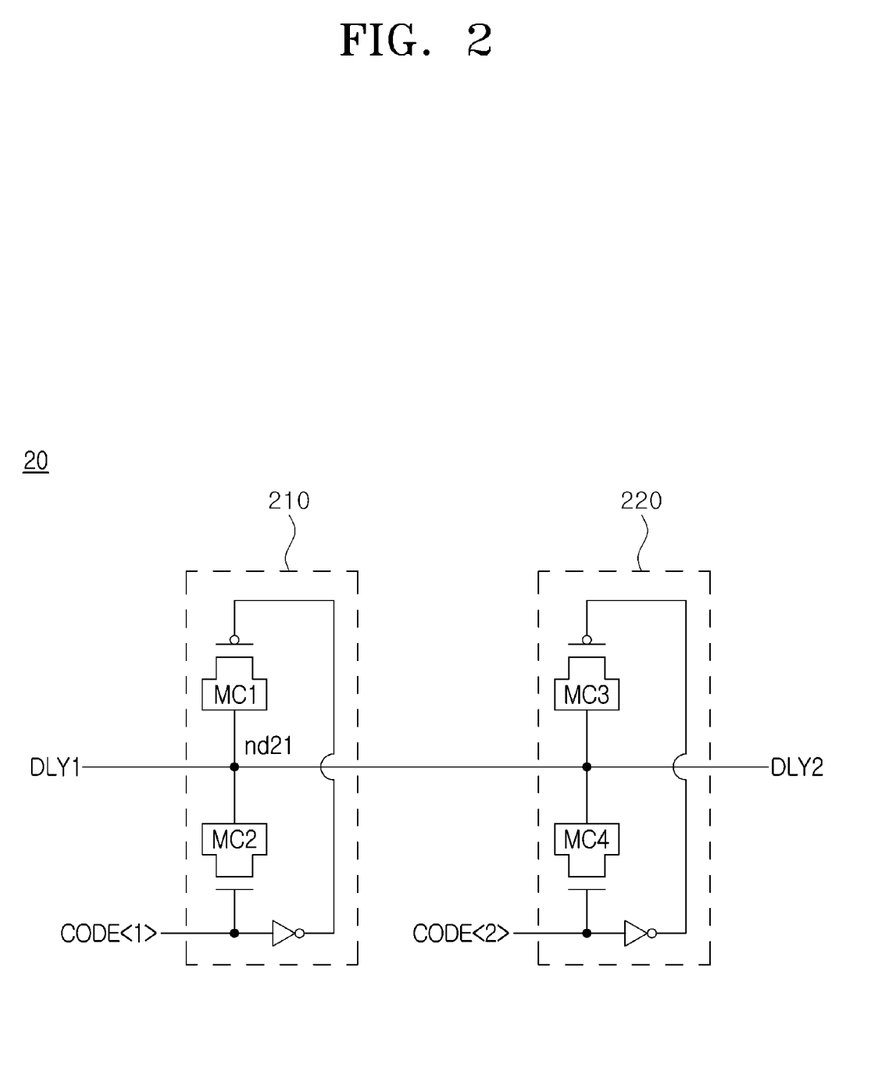
FIG. 2 is a circuit diagram illustrating a representation of an example of the configuration of the delay amount adjustment circuit included in the delay circuit shown in FIG. 1.

Referring to FIG. 2, the delay amount adjustment circuit 20 may include a first delay amount adjustment circuit 210 and a second delay amount adjustment circuit 220.

The first delay amount adjustment circuit 210 may include a first capacitor MC1 and a second capacitor MC2 which are coupled to a node nd21. The first capacitor MC1 and the second capacitor MC2 of the first delay amount adjustment circuit 210 may be turned on in response to the first code signal CODE<1>. The first capacitor MC1 and the second capacitor MC2 of the first delay amount adjustment circuit 210 may be turned on and increase the capacitance value of the node nd21 in the case where the first code signal CODE<1> is enabled to a logic high level. The first capacitor MC1 may be implemented by a MOS capacitor which is implemented by a PMOS transistor. The second capacitor MC2 may be implemented by a MOS capacitor which is implemented by an NMOS transistor.

The second delay amount adjustment circuit 220 may include a third capacitor MC3 and a fourth capacitor MC4 which are coupled to the node nd21. The third capacitor MC3 and the fourth capacitor MC4 of the second delay amount adjustment circuit 220 may be turned on in response to the second code signal CODE<2>. The third capacitor MC3 and the fourth capacitor MC4 of the second delay amount adjustment circuit 220 may be turned on and increase the capacitance value of the node nd21 in the case where the second code signal CODE<2> is enabled to a logic high level. The third capacitor MC3 may be implemented by a MOS capacitor which is implemented by a PMOS transistor. The fourth capacitor MC4 may be implemented by a MOS capacitor which is implemented by an NMOS transistor.

The capacitance values of the third capacitor MC3 and the fourth capacitor MC4 may be set to be larger than the first capacitor MC1 and the second capacitor MC2. The capacitance values of the first capacitor MC1, the second capacitor MC2, the third capacitor MC3 and the fourth capacitor MC4 may be set variously depending on an embodiment.

Such a delay amount adjustment circuit 20 may generate the second delayed signal DLY2 by delaying the first delayed signal DLY1 with the delay amount adjusted in response to the first code signal CODE<1> and the second code signal CODE<2>.

Figure 3:
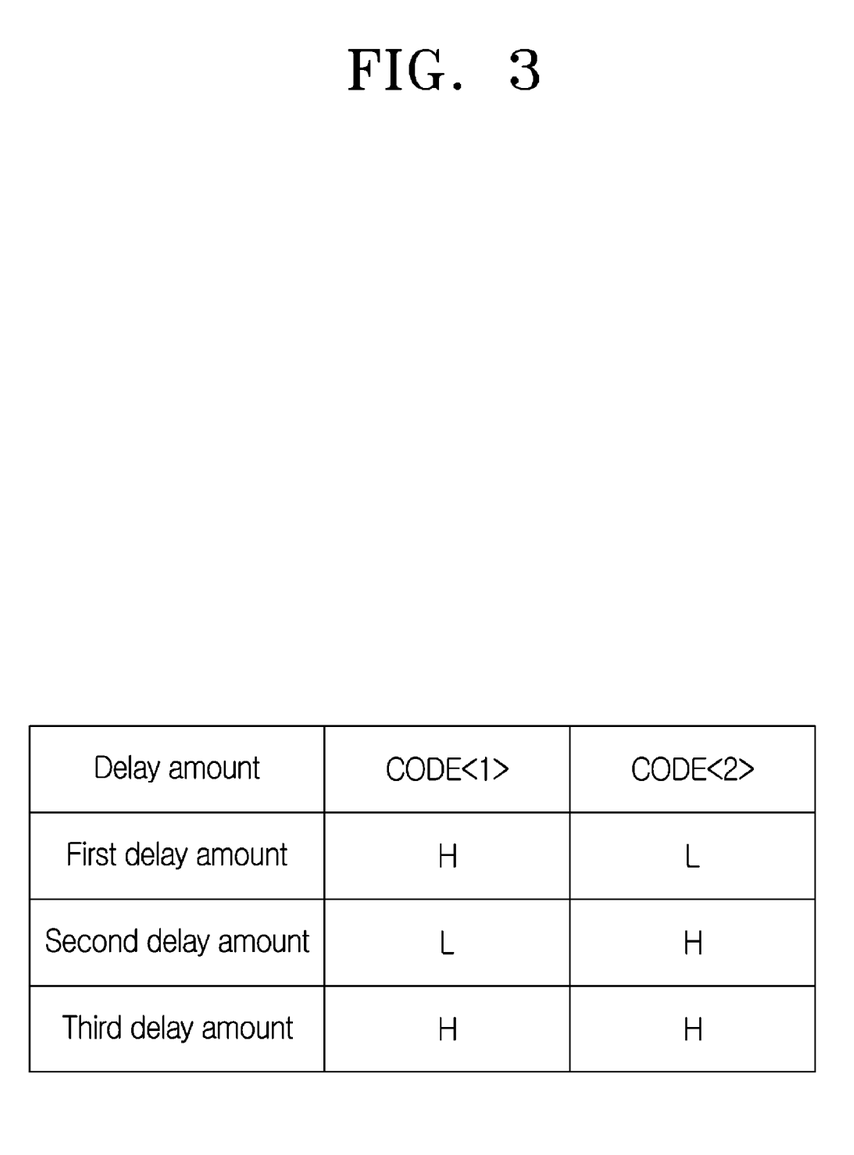
FIG. 3 is a representation of an example of a table to assist in the explanation of the operation of the delay amount adjustment circuit shown in FIG. 2.

For example, the delay amount of the delay amount adjustment circuit 20 set depending on the first code signal CODE<1> and the second code signal CODE<2> will be described below with reference to FIG. 3.

The delay amount adjustment circuit 20 may be set to a first delay amount in the case where the first code signal CODE<1> is enabled to the logic high level and the second code signal CODE<2> is disabled to a logic low level. In the delay amount adjustment circuit 20, the capacitance value set by the first delay amount adjustment circuit 210 may be coupled to the node nd21 in the case where the first code signal CODE<1> is enabled to the logic high level and the second code signal CODE<2> is disabled to the logic low level. The capacitance value set by the first delay amount adjustment circuit 210 may be set to the aforementioned first delay amount.

The delay amount adjustment circuit 20 may be set to a second delay amount in the case where the first code signal CODE<1> is disabled to a logic low level and the second code signal CODE<2> is enabled to the logic high level. In the delay amount adjustment circuit 20, the capacitance value set by the second delay amount adjustment circuit 220 may be coupled to the node nd21 in the case where the first code signal CODE<1> is disabled to the logic low level and the second code signal CODE<2> is enabled to the logic high level. The capacitance value set by the second delay amount adjustment circuit 220 may be set to the aforementioned second delay amount.

The delay amount adjustment circuit 20 may be set to a third delay amount in the case where the first code signal CODE<1> is enabled to the logic high level and the second code signal CODE<2> is enabled to the logic high level. In the delay amount adjustment circuit 20, the capacitance value set by the first delay amount adjustment circuit 210 and the second delay amount adjustment circuit 220 may be coupled to the node nd21 in the case where the first code signal CODE<1> is enabled to the logic high level and the second code signal CODE<2> is enabled to the logic high level. The capacitance value set by the first delay amount adjustment circuit 210 and the second delay amount adjustment circuit 220 may be set as the aforementioned third delay amount.

Figure 4:
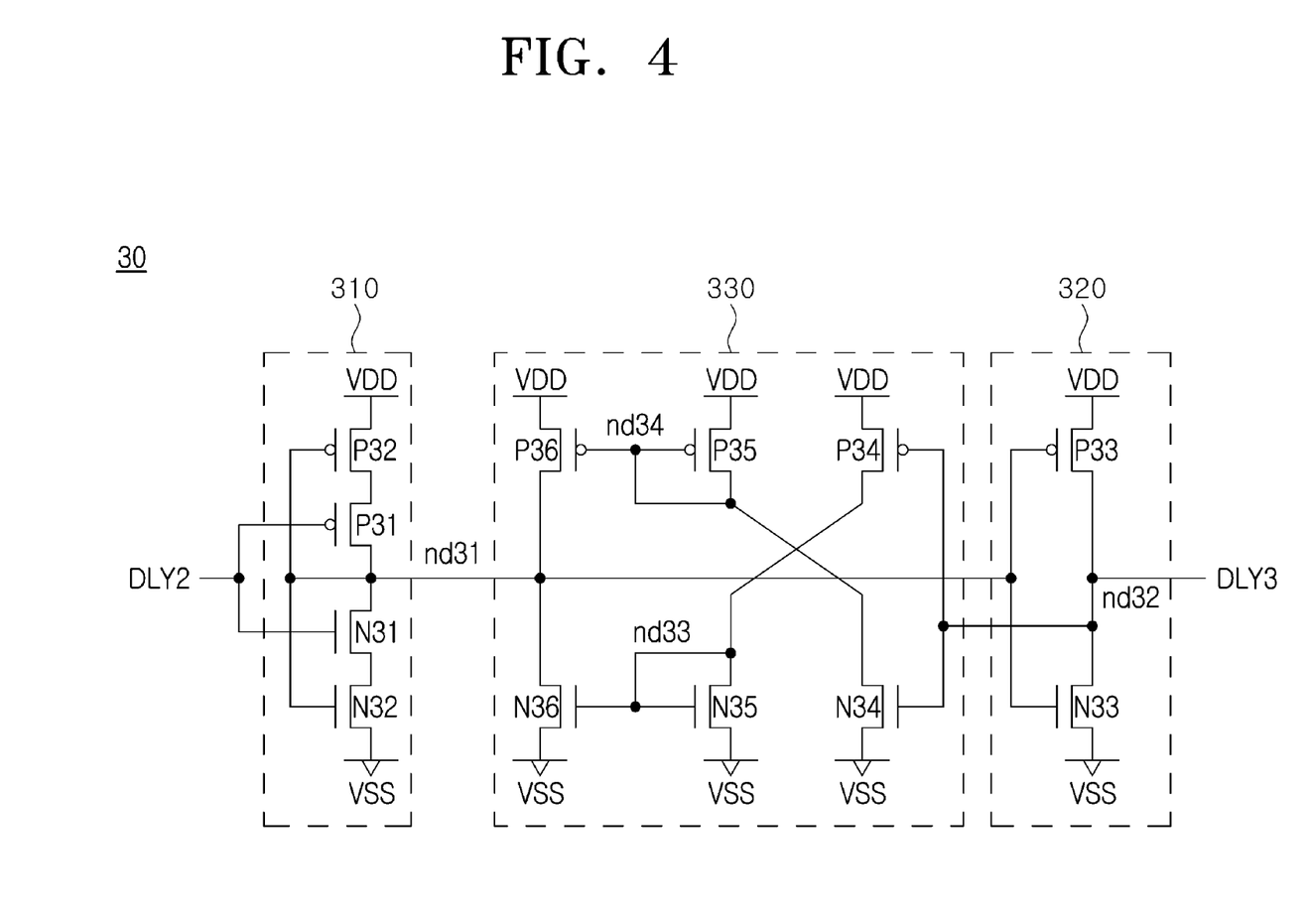
FIG. 4 is a circuit diagram illustrating a representation of an example of the configuration of the voltage adjustment circuit included in the delay circuit shown in FIG. 1.

Referring to FIG. 4, the voltage adjustment circuit 30 may include a first driving circuit 310, a second driving circuit 320 and a third driving circuit 330.

The first driving circuit 310 may include PMOS transistors P31 and P32 which are coupled in series between the power supply voltage VDD and a node nd31. The first driving circuit 310 may include NMOS transistors N31 and N32 which are coupled in series between the node nd31 and the ground voltage VSS. The PMOS transistor P31 and the NMOS transistor N31 may be turned on depending on the voltage level of the second delayed signal DLY2 and drive the node nd31. The PMOS transistor P32 and the NMOS transistor N32 may be turned on depending on the voltage level of the node nd31.

In the first driving circuit 310 configured as mentioned above, in the case where the voltage level of the second delayed signal DLY2 is a voltage level lower than a preset level and the voltage level of the node nd31 is a voltage level lower than the preset level, a driving force for driving the node nd31 to the level of the power supply voltage VDD may be increased. In the first driving circuit 310, in the case where the voltage level of the second delayed signal DLY2 is a voltage level higher than the preset level and the voltage level of the node nd31 is a voltage level higher than the preset level, a driving force for driving the node nd31 to the level of the ground voltage VSS may be increased.

The preset level may be set to a voltage level for turning on a PMOS transistor and an NMOS transistor. For example, the PMOS transistor P31 is turned on in the case where the voltage level of the second delayed signal DLY2 is a voltage level (a logic low level) lower than the preset level, and the NMOS transistor N31 is turned on in the case where the voltage level of the second delayed signal DLY2 is a voltage level (a logic high level) higher than the preset level.

The second driving circuit 320 may include a PMOS transistor P33 which is coupled between the power supply voltage VDD and a node nd32 and an NMOS transistor N33 which is coupled between the node nd32 and the ground voltage VSS. The PMOS transistor P33 and the NMOS transistor N33 may be turned on depending on the voltage level of the node nd31 and drive the node nd32. The second driving circuit 320 may generate the third delayed signal DLY3 as the node nd32 is driven depending on the voltage level of the node nd31.

In the second driving circuit 320 configured as mentioned above, in the case where the voltage level of the node nd31 is a voltage level lower than a preset level, a driving force for driving the node nd32 to the level of the power supply voltage VDD may be increased. In the second driving circuit 320, in the case where the voltage level of the node nd31 is a voltage level higher than the preset level, a driving force for driving the node nd32 to the level of the ground voltage VSS may be increased.

The third driving circuit 330 may include a PMOS transistor P34 which is coupled between the power supply voltage VDD and a node nd33, an NMOS transistor N34 which is coupled between a node nd34 and the ground voltage VSS, a PMOS transistor P35 which is coupled between the power supply voltage VDD and the node nd34, an NMOS transistor N35 which is coupled between the node nd33 and the ground voltage VSS, a PMOS transistor P36 which is coupled between the power supply voltage VDD and the node nd31 and an NMOS transistor N36 which is coupled between the node nd31 and the ground voltage VSS.

The PMOS transistor P34 and the NMOS transistor N34 may be turned on depending on the voltage level of the third delayed signal DLY3 and drive the node nd33 and the node nd34. The PMOS transistor P34 may be turned in the case where the third delayed signal DLY3 is a voltage level lower than a preset level and drive the node nd33 to the level of the power supply voltage VDD. The NMOS transistor N34 may be turned in the case where the third delayed signal DLY3 is a voltage level higher than the preset level and drive the node nd34 to the level of the ground voltage VSS.

The PMOS transistor P35 and the PMOS transistor P36 may be turned on depending on the voltage level of the node nd34 and drive the node nd31 to the level of the power supply voltage VDD. The PMOS transistor P35 and the PMOS transistor P36 may be turned on in the case where the voltage level of the node nd34 is a voltage level lower than a preset level and drive the node nd31 to the level of the power supply voltage VDD.

The NMOS transistor N35 and the NMOS transistor N36 may be turned on depending on the voltage level of the node nd33 and drive the node nd31 to the level of the ground voltage VSS. The NMOS transistor N35 and the NMOS transistor N36 may be turned on in the case where the voltage level of the node nd33 is a voltage level higher than a preset level and drive the node nd31 to the level of the ground voltage VSS.

In the third driving circuit 330 configured as mentioned above, in the case where the voltage level of the node nd32 is a voltage level lower than the preset level, a driving force for driving the node nd31 to the ground voltage VSS may be increased. In the third driving circuit 330, in the case where the voltage level of the node nd32 is a voltage level higher than the preset level, a driving force for driving the node nd31 to the power supply voltage VDD may be increased.

Figure 5:
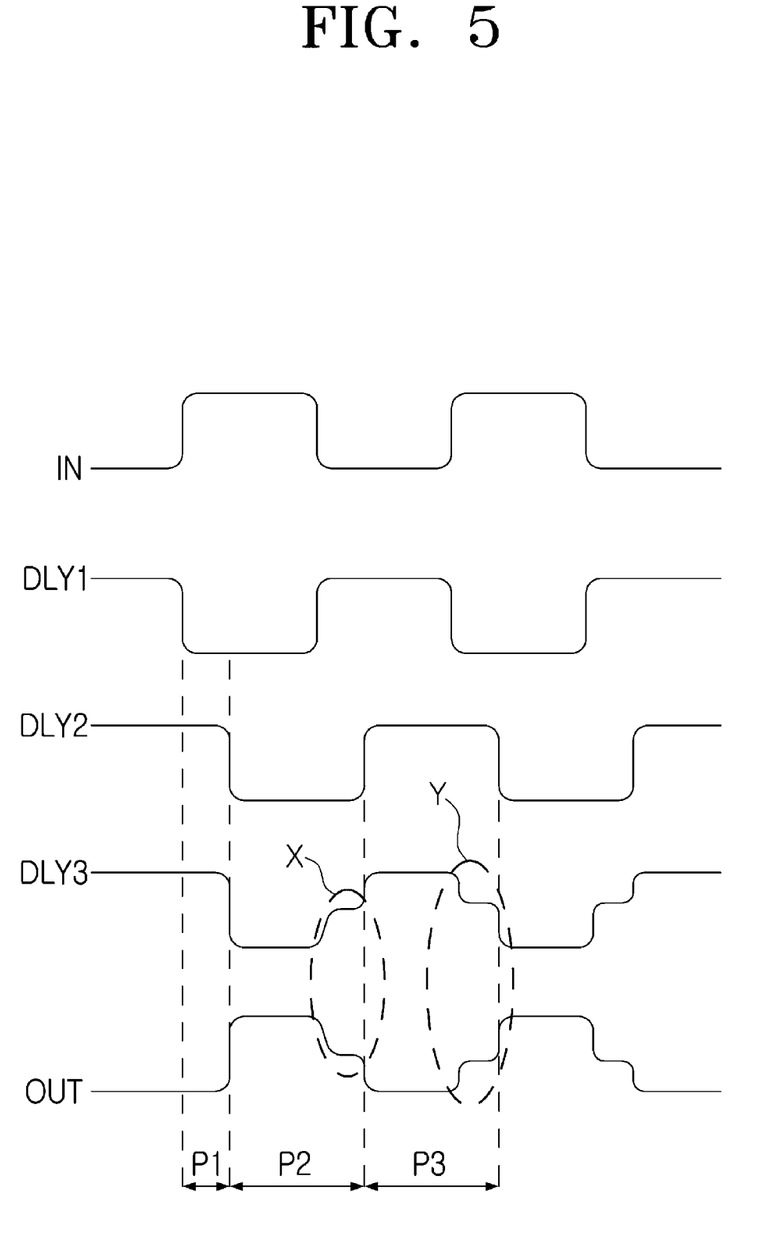
FIG. 5 is a representation of an example of a diagram to assist in the explanation of the operation of the delay circuit in accordance with the embodiment.

The operation of the delay circuit in accordance with an embodiment will be described below with reference to FIG. 5 by taking as an example a case where the input signal IN is a signal which cyclically toggles.

The first buffer 10 generates the first delayed signal DLY1 by inverting and buffering the input signal IN.

The delay amount adjustment circuit 20 generates the second delayed signal DLY2 by delaying the first delayed signal DLY1 with a delay amount P1 adjusted in response to the first code signal CODE<1> and the second code signal CODE<2>.

In the first driving circuit 310 of the voltage adjustment circuit 30, in a period P2 in which the voltage level of the second delayed signal DLY2 is a voltage level lower than the preset level, a driving force for driving the node nd31 to the level of the power supply voltage VDD is increased.

In the second driving circuit 320 of the voltage adjustment circuit 30, as the voltage level of the node nd31 is driven to the level of the power supply voltage VDD, a driving force for driving the node nd32 to the level of the ground voltage VSS is increased. That is to say, the second driving circuit 320 of the voltage adjustment circuit 30 generates the third delayed signal DLY3 which is driven to a logic low level.

In the third driving circuit 330 of the voltage adjustment circuit 30, as the voltage level of the node nd32 is driven to the level of the ground voltage VSS, a driving force for driving the node nd31 to the ground voltage VSS is increased.

In the second driving circuit 320 of the voltage adjustment circuit 30, as the voltage level of the node nd31 is driven to the ground voltage VSS, a driving force for driving the node nd32 to the level of the power supply voltage VDD is increased. In other words, the second driving circuit 320 of the voltage adjustment circuit 30 generates the third delayed signal DLY3 which has a voltage level higher than the logic low level in a period X.

The second buffer 40 generates the output signal OUT by inverting and buffering the third delayed signal DLY3.

The delay circuit in accordance with an embodiment generates the output signal OUT which has a voltage level lower than a logic high level, by lowering the voltage level of the node nd31 in the period X of the period P2 in which the voltage level of the second delayed signal DLY2 is a voltage level lower than the preset level.

In the first driving circuit 310 of the voltage adjustment circuit 30, in a period P3 in which the voltage level of the second delayed signal DLY2 is a voltage level higher than the preset level, a driving force for driving the node nd31 to the level of the ground voltage VSS is increased.

In the second driving circuit 320, as the voltage level of the node nd31 is driven to the level of the ground voltage VSS, a driving force for driving the node nd32 to the level of the power supply voltage VDD is increased. That is to say, the second driving circuit 320 generates the third delayed signal DLY3 which is driven to a logic high level.

In the third driving circuit 330, as the voltage level of the node nd32 is driven to the level of the power supply voltage VDD, a driving force for driving the node nd31 to the power supply voltage VDD is increased.

In the second driving circuit 320, as the voltage level of the node nd31 is driven to the power supply voltage VDD, a driving force for driving the node nd32 to the level of the ground voltage VSS is increased. In other words, the second driving circuit 320 of the voltage adjustment circuit 30 generates the third delayed signal DLY3 which has a voltage level lower than the logic high level in a period Y.

The second buffer 40 generates the output signal OUT by inverting and buffering the third delayed signal DLY3.

The delay circuit in accordance with an embodiment generates the output signal OUT which has a voltage level higher than a logic low level, by raising the voltage level of the node nd31 in the period Y of the period P3 in which the voltage level of the second delayed signal DLY2 is a voltage level higher than the preset level.

The delay circuit in accordance with an embodiment may reduce a current consumption amount by decreasing a period in which the output signal OUT is driven to the power supply voltage VDD or the ground voltage VSS, through being fed back with the voltage level of the node nd32 included in the delay circuit for delaying the input signal IN and thereby lowering or raising the voltage level of the node nd31.

Figure 6:
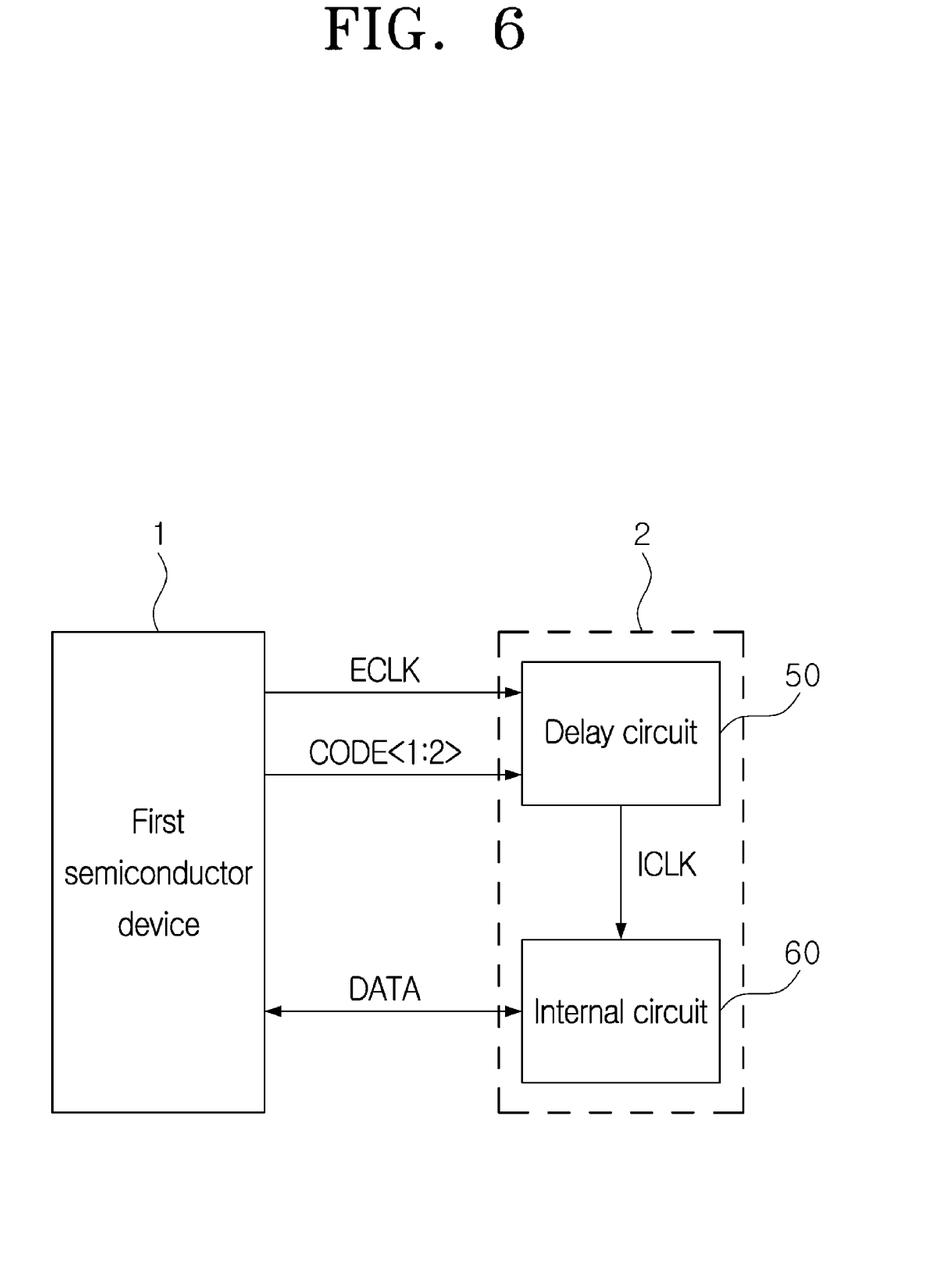
FIG. 6 is a block diagram illustrating a representation of an example of the configuration of a semiconductor system in accordance with an embodiment.

Referring to FIG. 6, a semiconductor system in accordance with an embodiment may include a first semiconductor device 1 and a second semiconductor device 2. The second semiconductor device 2 may include a delay circuit 50 and an internal circuit 60.

The first semiconductor device 1 may output an external clock ECLK, a first code signal CODE<1> and a second code signal CODE<2>. The first semiconductor device 1 may input and output data DATA. The external clock ECLK may be set as a signal which cyclically toggles to synchronize the first semiconductor device 1 and the second semiconductor device 2. The first code signal CODE<1> and the second code signal CODE<2> may be set as signals for adjusting the delay amount of the delay circuit 50 included in the second semiconductor device 2.

The delay circuit 50 may generate an internal clock ICLK by delaying the external clock ECLK according to the delay amount adjusted depending on the combination of the first code signal CODE<1> and the second code signal CODE<2>. The delay circuit 50 may be adjusted in a driving force for driving the internal clock ICLK, depending on the voltage level of a node included therein. Since the delay circuit 50 shown in FIG. 5 is implemented by the same circuit and performs the same operation as the delay circuit shown in FIG. 1, detailed description thereof will be omitted herein. The external clock ECLK shown in FIG. 5 may be set as the input signal IN shown in FIG. 1, and the internal clock ICLK may be set as the output signal OUT.

The internal circuit 60 may input and output data DATA in synchronization with the internal clock ICLK. The internal circuit 60 may receive data DATA from the first semiconductor device 1 in synchronization with the internal clock ICLK in a write operation. The internal circuit 60 may store data DATA in synchronization with the internal clock ICLK in the write operation. The internal circuit 60 may output stored data DATA to the first semiconductor device 1 in synchronization with the internal clock ICLK in a read operation. The internal circuit 60 may be implemented by a memory circuit which stores or outputs data DATA.

The second semiconductor device 2 configured as mentioned above may be adjusted in its delay amount depending on the combination of the first code signal CODE<1> and the second code signal CODE<2>, and may generate the internal clock ICLK by delaying the external clock ECLK according to the adjusted delay amount. The semiconductor device 2 may input and output data DATA in synchronization with the internal clock ICLK. The second semiconductor device 2 may be adjusted in a driving force for driving the internal clock ICLK, depending on the voltage level of a node included in a path through which the internal clock ICLK is delayed.

The semiconductor system in accordance with an embodiment configured as mentioned above may reduce a current consumption amount by decreasing a period in which the internal clock ICLK is driven to the level of a power supply voltage (VDD) or a ground voltage (VSS), through being fed back with the voltage level of a node included in the delay circuit 50 for delaying the external clock ECLK.

The delay circuit and the semiconductor system described above with reference to FIGS. 1 to 6 may be applied to an electronic system which includes a memory system, a graphic system, a computing system or a mobile system, etc. For example, referring to FIG. 7, an electronic system 1000 in accordance with an embodiment may include a data storage 1001, a memory controller 1002, a buffer memory 1003, and an input and output (input/output) interface 1004.

Figure 7:
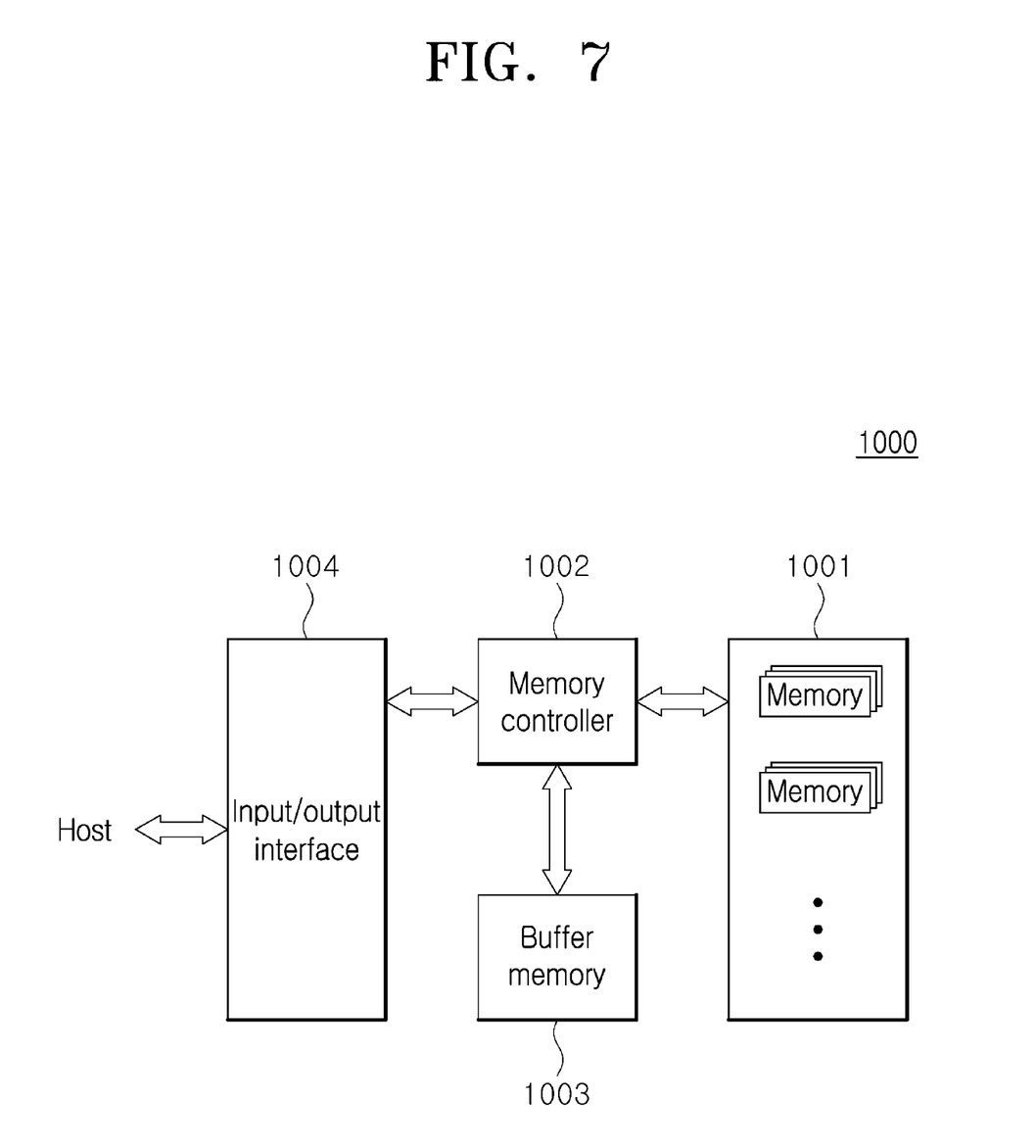
FIG. 7 is a diagram illustrating a representation of an example of the configuration of an electronic system to which the delay circuit and the semiconductor system shown in FIGS. 1 to 6 are applied.

The data storage 1001 stores data applied from the memory controller 1002, and reads out stored data and outputs the read-out data to the memory controller 1002, according to control signals from the memory controller 1002. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM), etc.

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 shown in FIG. 6. While the memory controller 1002 is illustrated as one block in FIG. 7, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory), etc. The buffer memory 1003 may include the second semiconductor device 2 shown in FIG. 6.

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE, etc.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card, etc.

While various embodiments have been described above, it will be understood to those skilled in the art that the embodiments described are by way of example only. Accordingly, the delay circuit and the semiconductor system using the same described herein should not be limited based on the described embodiments.

What is claimed is:

1. A delay circuit comprising:
   a first buffer configured to generate a first delayed signal by buffering an input signal;
   a voltage adjustment circuit configured to generate a second delayed signal by delaying the first delayed signal, and configured to adjust a voltage level of the second delayed signal by adjusting a voltage of a first node, included in a path through which the input signal is delayed, in response to the second delayed signal;
   a second buffer configured to generate an output signal by buffering the second delayed signal; and
   wherein, the voltage adjustment circuit reduces a period during which the second delayed signal is driven to a power supply voltage or a ground voltage.

2. The delay circuit according to claim 1, wherein the input signal is set as a signal including at least one pulse generated for a predetermined period or a signal which cyclically toggles.

3. The delay circuit according to claim 1, wherein the voltage adjustment circuit comprises:
   a first driving circuit configured to adjust a driving force for driving the first node to a power supply voltage or a ground voltage, depending on a voltage level of the first node in response to the first delayed signal;
   a second driving circuit configured to adjust a driving force for driving a second node through which the second delayed signal is outputted, to the power supply voltage or the ground voltage, depending on the voltage level of the first node; and
   a third driving circuit configured to adjust a driving force for driving the first node to the power supply voltage or the ground voltage, depending on a voltage level of the second node.

4. The delay circuit according to claim 3, wherein the first driving circuit is increased in a driving force for driving the first node to the power supply voltage, when the voltage level of the first node is a voltage level lower than a preset level, and is increased in a driving force for driving the first node to the ground voltage, when the voltage level of the first node is higher than the preset level.

5. The delay circuit according to claim 3, wherein the third driving circuit is increased in a driving force for driving the first node to the ground voltage, when the voltage level of the second node is a voltage level lower than a preset level, and is increased in a driving force for driving the first node to the power supply voltage, when the voltage level of the second node is higher than the preset level.

6. The delay circuit according to claim 1, further comprising:
   a delay amount adjustment circuit configured to adjust the delay amount of the first delayed signal in response to first and second code signals.

7. A delay circuit comprising:
   a first buffer configured to generate a first delayed signal by buffering an input signal;
   a delay amount adjustment circuit configured to adjust a capacitance value of a first node, included in a path through which the input signal is delayed, in response to first and second codes, and configured to generate a second delayed signal by delaying the first delayed signal according to the adjusted capacitance value;
   a voltage adjustment circuit configured to generate a third delayed signal by delaying the second delayed signal, and configured to adjust a voltage level of the third delayed signal by adjusting a voltage of a second node, included in the path through which the input signal is delayed, in response to the third delayed signal;
   a second buffer configured to generate an output signal by buffering the third delayed signal; and wherein, the voltage adjustment circuit reduces a period during which the third delayed signal is driven to a power supply voltage or a ground voltage.

8. The delay circuit according to claim 7, wherein the input signal is set as a signal including at least one pulse generated for a predetermined period or a signal which cyclically toggles.

9. The delay circuit according to claim 7, wherein the delay amount adjustment circuit comprises:
   a first delay amount adjustment circuit configured to be coupled to the first node and supply a first capacitance value to the first node in response to the first code signal; and
   a second delay amount adjustment circuit configured to be coupled to the first node and supply a second capacitance value to the first node in response to the second code signal.

10. The delay circuit according to claim 7, wherein the delay amount adjustment circuit is set to a first delay amount when the first code signal is enabled, is set to a second delay amount when the second code signal is enabled and is set to a third delay amount when both the first and second code signals are enabled.

11. The delay circuit according to claim 10, wherein the third delay amount is greater than the second delay amount, and the second delay amount is greater than the first delay amount.

12. The delay circuit according to claim 7, wherein the voltage adjustment circuit comprises:
   a first driving circuit configured to adjust a driving force for driving the second node to a power supply voltage or a ground voltage, depending on a voltage level of the second node in response to the second delayed signal;
   a second driving circuit configured to adjust a driving force for driving a third node through which the third delayed signal is outputted, to the power supply voltage or the ground voltage, depending on the voltage level of the second node; and
   a third driving circuit configured to adjust a driving force for driving the second node to the power supply voltage or the ground voltage, depending on a voltage level of the third node.

13. The delay circuit according to claim 12, wherein the first driving circuit is increased in a driving force for driving the second node to the power supply voltage, when the voltage level of the second node is a voltage level lower than a preset level, and is increased in a driving force for driving the second node to the ground voltage, when the voltage level of the second node is higher than the preset level.

14. The delay circuit according to claim 12, wherein the third driving circuit is increased in a driving force for driving the second node to the ground voltage, when the voltage level of the third node is a voltage level lower than a preset level, and is increased in a driving force for driving the second node to the power supply voltage, when the voltage level of the third node is higher than the preset level.

15. A semiconductor system comprising:
   a first semiconductor device configured to receive an external clock, first and second code signals, and input and output data, adjust a delay amount depending on a combination of the first and second code signals, generate an internal clock by delaying the external clock according to the adjusted delay amount, and input and output data in synchronization with the internal clock, the first semiconductor device being adjusted in a driving force for driving the internal clock, depending on a voltage level of a node included in a path through which the internal clock is delayed; and
   wherein, the first semiconductor device reduces a period during which the internal clock is driven to a power supply voltage or a ground voltage.

16. The semiconductor system according to claim 15, further comprising:
   a second semiconductor device configured to output the external clock and the first and second code signals, and the input and output data.

17. The semiconductor system according to claim 15, wherein the first semiconductor device comprises:
   a delay circuit configured to generate the internal clock by delaying the external clock according to the delay amount adjusted depending on the combination of the first and second code signals, and adjusting a driving force for driving the internal clock, depending on the voltage level of the node; and
   an internal circuit configured to input and output data in synchronization with the internal clock.

18. The semiconductor system according to claim 17, wherein the delay circuit comprises:
   a first buffer configured to generate a first delayed signal by buffering the external clock;
   a delay amount adjustment circuit configured to adjust a capacitance value of a first node, included in a path through which the first delayed signal is delayed, in response to the first and second codes, and generate a second delayed signal by delaying the first delayed signal according to the adjusted capacitance value;
   a voltage adjustment circuit configured to generate a third delayed signal by delaying the second delayed signal, and adjust a voltage level of the third delayed signal by adjusting a voltage of a second node, included in a path through which the second delayed signal is delayed, in response to the third delayed signal; and
   a second buffer configured to generate the internal clock by buffering the third delayed signal.

19. The semiconductor system according to claim 18, wherein the delay amount adjustment circuit comprises:
   a first delay amount adjustment circuit configured to be coupled to the first node and supply a first capacitance value to the first node in response to the first code signal; and
   a second delay amount adjustment circuit configured to be coupled to the first node and supply a second capacitance value to the first node in response to the second code signal.

20. The semiconductor system according to claim 18, wherein the voltage adjustment circuit comprises:
   a first driving circuit configured to adjust a driving force for driving the second node to a power supply voltage or a ground voltage, depending on a voltage level of the second node in response to the second delayed signal;
   a second driving circuit configured to adjust a driving force for driving a third node through which the third delayed signal is outputted, to the power supply voltage or the ground voltage, depending on the voltage level of the second node; and
   a third driving circuit configured to be adjusted in a driving force for driving the second node to the power supply voltage or the ground voltage, depending on a voltage level of the third node.

21. The semiconductor system according to claim 20, wherein the first driving circuit is increased in a driving force for driving the second node to the power supply voltage, when the voltage level of the second node is a voltage level lower than a preset level, and is increased in a driving force for driving the second node to the ground voltage, when the voltage level of the second node is higher than the preset level.

22. The semiconductor system according to claim 20, wherein the third driving circuit is increased in a driving force for driving the second node to the ground voltage, when the voltage level of the third node is a voltage level lower than a preset level, and is increased in a driving force for driving the second node to the power supply voltage, when the voltage level of the third node is higher than the preset level.

* * * * *